United States Patent [19]
Foulke et al.

[11] Patent Number: 4,603,897
[45] Date of Patent: Aug. 5, 1986

[54] VACUUM PICKUP APPARATUS

[75] Inventors: Richard F. Foulke, Carlisle; Kenneth A. Winchell, Melrose, both of Mass.

[73] Assignee: Poconics International, Inc., Woburn, Mass.

[21] Appl. No.: 496,460

[22] Filed: May 20, 1983

[51] Int. Cl.⁴ .............................................. B65G 17/32
[52] U.S. Cl. .................................... 294/64.1; 294/907; 901/35; 901/45; 414/404; 414/416; 414/730; 414/732; 414/737
[58] Field of Search .................... 294/907, 64.2, 64 R; 271/31, 31.1, 103, 105, 108; 414/71, 72, 121, 275, 331, 403, 404, 405, 406, 407, 408, 409, 410, 411, 412, 413, 414, 415, 416, 730, 732, 737, 752, 744 B, 744 C; 318/640; 901/9, 40, 46, 45, 35

[56] References Cited

U.S. PATENT DOCUMENTS

| | | | |
|---|---|---|---|
| 3,054,036 | 9/1962 | Lenk et al. | 318/568 |
| 3,272,350 | 9/1966 | Pflaumer et al. | 414/416 |
| 3,697,112 | 10/1972 | Nielson et al. | 414/71 X |
| 3,881,605 | 5/1975 | Grossman | 414/416 X |
| 4,156,835 | 5/1979 | Whitney et al. | 901/46 X |
| 4,166,543 | 9/1979 | Dahlstrom | 901/46 X |
| 4,178,113 | 12/1979 | Beaver, II et al. | 414/416 X |
| 4,266,905 | 5/1981 | Birk et al. | 901/40 X |
| 4,311,427 | 1/1982 | Coad et al. | 414/417 X |
| 4,356,554 | 10/1982 | Susnjara et al. | 414/730 X |
| 4,392,766 | 7/1983 | Blunt | 414/121 X |
| 4,513,957 | 4/1985 | Schaefer, Jr. | 271/31.1 X |

FOREIGN PATENT DOCUMENTS

| | | | |
|---|---|---|---|
| 3005139 | 8/1981 | Fed. Rep. of Germany | 414/730 |
| 0830292 | 5/1981 | U.S.S.R. | 414/730 |
| 0881668 | 11/1981 | U.S.S.R. | 414/730 |

OTHER PUBLICATIONS

Garrison et al., Pneumatic Touch Sensor, IBM Technical Disclosure Bulletin, vol. 16, No. 6, Nov. 1973, pp. 2037–2040.

Mongodin, Semiconductor Production, New Automatic Wafer for Semi Standard Plastic Carriers, Autumn 1980, pp. 30–33.

Primary Examiner—Robert J. Spar
Assistant Examiner—Ken Muncy

[57] ABSTRACT

Apparatus that uses a suction engagement element to transport semiconductor wafers between processing boats and detects when suction engagement has not occurred despite the engagement element having been moved toward a wafer a distance sufficient to enable said engagement, and then adjusts the position of the engagement element relative to the object (e.g., by backing up and trying again or by pivoting the engagement element) to facilitate the suction engagement.

10 Claims, 8 Drawing Figures

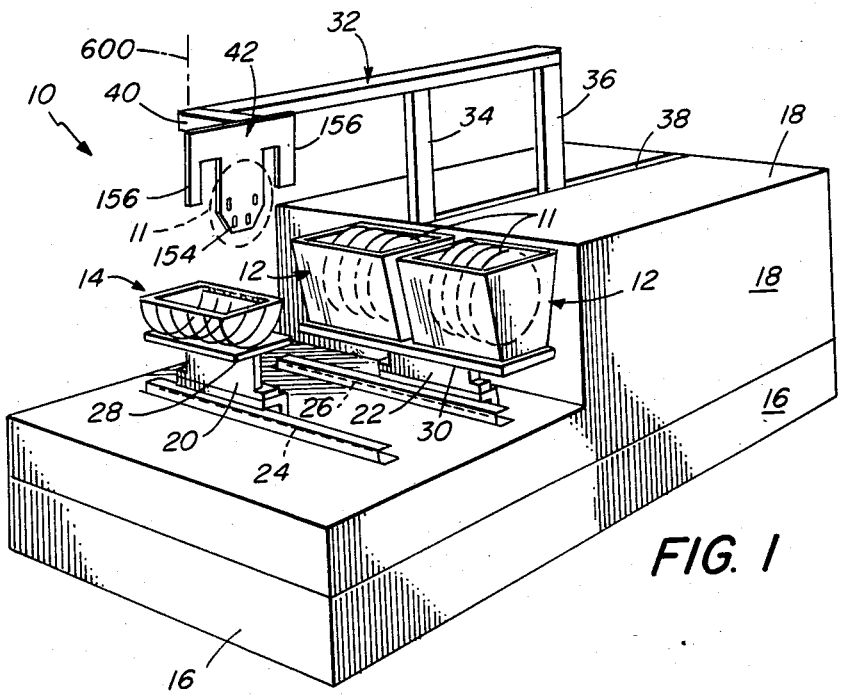
FIG. 1
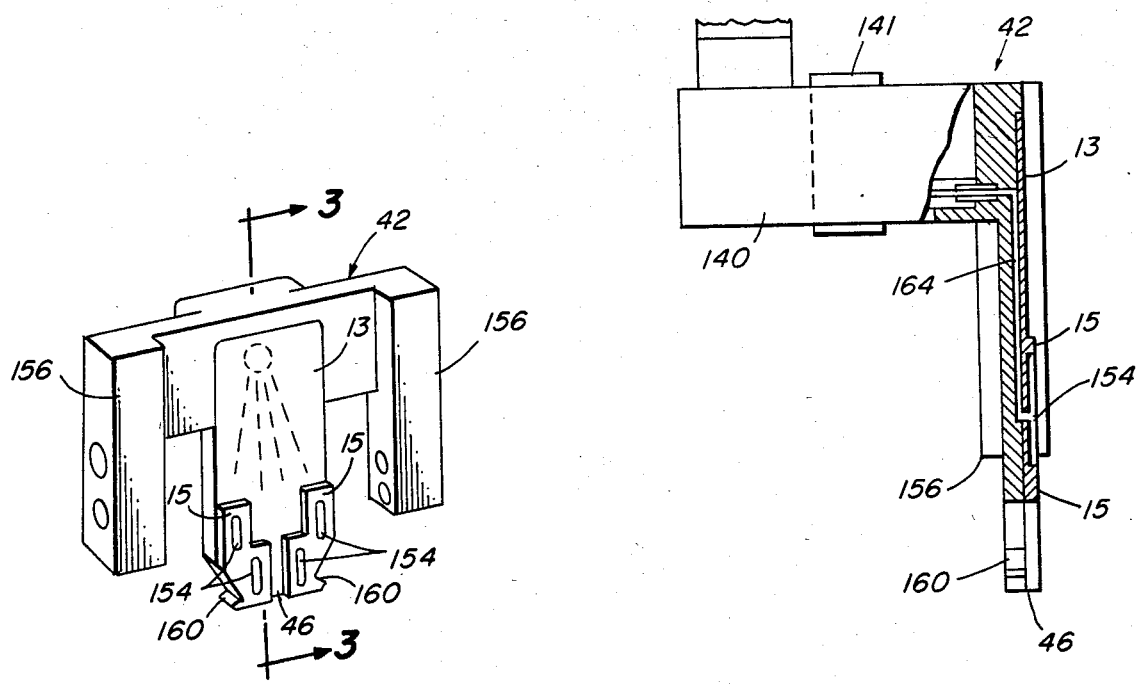
FIG. 2
FIG. 3

VACUUM PICKUP APPARATUS

BACKGROUND OF THE INVENTION

This invention relates to apparatus for automatic, precise transport of objects, e.g., semiconductor wafers.

It is desirable to rapidly and automatically transfer semiconductor wafers from plastic storage boats to quartz boats (in which they are introduced into a diffusion furnace), and vice versa, without introducing contamination onto the surfaces of the wafers.

SUMMARY OF THE INVENTION

In general, the invention features apparatus for transporting an object including an engagement element with a plurality of openings, suction means for providing a below-atmospheric pressure or vacuum at the openings for the purpose of adhering the object to the engagement element, transport means for transporting the engagement element relative to the object to bring the openings close enough to an engagement surface of the object to enable suction engagement of the object at the openings, position detection means for sensing the relative position of the object and the engagement element, sensing means for sensing suction engagement at the openings, and processing means including engagement-failure-detection means responsive to the sensing and position detection means for detecting when suction engagement has not occurred despite the engagement element having been transported toward the object a distance sufficient to enable said engagement, and control means responsive to the engagement-failure-detection means for providing a control signal to the transport means to adjust the position of the engagement element relative to the object to facilitate the suction engagement.

In preferred embodiments the transport means includes means for moving the engagement element along an engagement direction; the control means includes means for causing the transport means to separate the element and object and to make at least one further attempt (preferably at least two attempts) to engage the object; the control means includes means for causing a change in the relative orientation (preferably by rotation) of the object and the element prior to the further attempt; the engagement surface is a flat surface, and the rotation is about an axis parallel to the engagement surface and between two openings; the control means includes means for causing the transport means to make attempts to engage the object at the initial orientation of the engagement element relative to the direction, and, if unsuccessful at engaging the object, to cause rotation of the engagement element in one direction to a new orientation and cause further attempts at engagement at the new orientation, and, if still unsuccessful in engaging the object, cause rotation of the engagement element in another direction and cause further attempts at engagement at this orientation, and, if still unsuccessful at engaging the object, provide an indication of failure to engage the object; the engagement-failure-detection means includes means to detect when suction engagement has occurred at one opening but not at another opening despite the engagement element having been transported toward the object a distance sufficient past engagement of the first opening to enable the engagement, and the control means includes means for providing a control signal to change the relative orientation between the engagement element and the object so as to move the unengaged opening toward the object; the sensing means includes pressure sensors connected to vacuum lines connecting the suction opening to the suction means; the transport means includes a motor driving an object holder and a clutch operably connected between the motor and the object holder, and the position detection means includes means detecting the position of the object holder; and the engagement-failure-detection means detects that the clutch is slipping.

The invention provides for vacuum transport of wafers and similar objects even when they are not initially aligned properly with the engagement element. This permits reductions in the number of times that the transfer operation must be halted in response to failures to engage objects, resulting in much more efficient transfer of objects with minimum operator input.

Other features and advantages of the invention will be apparent from the following description of the preferred embodiment, and from the claims.

DESCRIPTION OF THE PREFERRED EMBODIMENTS

Drawings

FIG. 1 is a perspective, somewhat diagrammatic view of apparatus for transporting wafers according to the invention.

FIG. 2 is a perspective view of a wafer engaging paddle used in the FIG. 1 apparatus.

FIG. 3 is a sectional view taken along 3—3 of FIG. 2.

(FIG. 4b is a partial view of one end of the arm.)

STRUCTURE

Figure 4A:
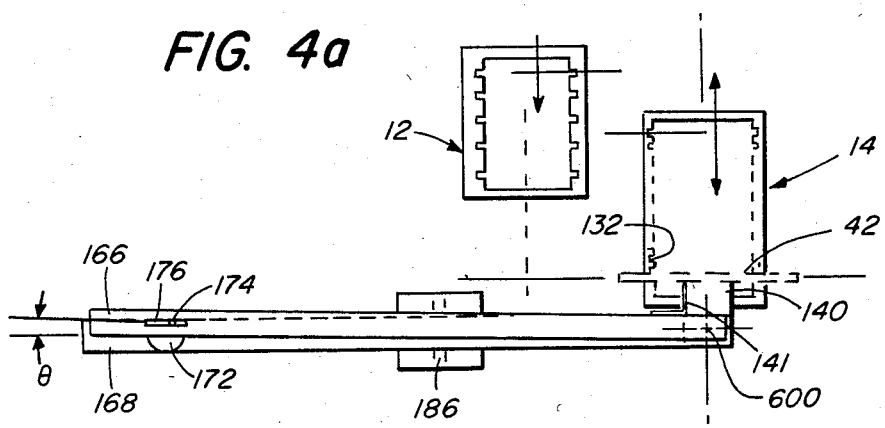
FIGS. 4a and 4b are plan views of the wafer engaging paddle and arm, showing the arm in two different angular positions.

Referring to FIG. 1, there is shown wafer handling device 10, for transferring semiconductor wafers 11 between plastic boats 12 and quartz boat 14 (in which the wafers are held when put into a diffusion furnace). Device 10 is described in more detail in U.S. patent application Ser. No. 381,292 filed May 24, 1982, now U.S. Pat. No. 4,493,606, which is hereby incorporated by reference.

Device 10 has base 16 (upon which cover 18 rests), trolleys 20, 22 for transporting the boats, and wafer transfer arm 32.

Trolleys 20, 22 extend through slots 24, 26 respectively, of cover 18. Trolley 20 has affixed to its upper end a platform 28, which supports quartz boat 14. Trolley 22 has affixed to its upper end a platform 30 to support plastic boats 12.

Wafer transfer arm 32 is attached to vertical arms 34, 36 which extend through slot 38 in cover 18. A right angle member 40 connects arm 32 to aluminum wafer paddle 42, which has four suction openings 154 in the center leg 46 of the paddle, for gripping wafers. At each vacuum opening 154, there is a picture-frame-like raised ridge (0.010 inch elevation) surrounding the opening. The openings and ridges are located so as to grip wafers nearer their edges than their centers.

Referring to FIGS. 2 and 3, paddle 42 has Teflon Polyperfluoroethylene sheet 13 laminated to one face of center leg 46. The Teflon Polyperfluoroethylene sheet (which has been etched to aid bonding) is bonded to the aluminum with Chemgrip epoxy adhesive (Chemplest Inc., Wayne, N.J.) and then machined to the desired thickness (about 0.020 inch). The overall thickness of center leg 46 is about 0.12 inch; this dimension is kept small to permit the paddle to be moved very close to either end of the boats so that wafers can be loaded into slots at the ends. Vacuum tubes 164 are inserted in grooves in the aluminum prior to application of the Teflon sheet. Vacuum fittings and lines (not shown) connect tubes 164 to a vacuum source. Four solenoid valves 504 (FIG. 6) and four pressure sensors 502 (FIG. 6), one each in each vacuum line, individually control and sense the vacuum at each opening 154.

An evacuated tank is connected to the main vacuum line and, with a main solenoid valve, is used to maintain vacuum at minimum of two openings 154 in the event of loss of the main source of vacuum. The pressure sensors in the vacuum lines provide information on which two openings have the best vacuum, and thus the best grip on a wafer. The valves for the other two openings are then shut to enable the evacuated tank to maintain vacuum only at the other two openings. The tank can maintain the vacuum long enough to allow the system to set down the wafer being held in one of the boats.

Figure 5:
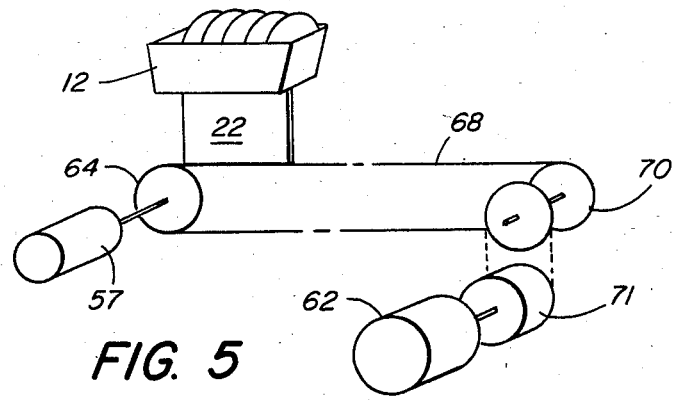
FIG. 5 is a diagrammatic perspective view of a trolley drive mechanism for the plastic boat.

Referring to FIG. 5, underneath cover 18, trolley 22 is connected to drive chain 68 supported by sprockets 64, 70. Sprocket 70 is driven via servo motor 62 connected through clutch 71. Sprocket 64 is connected to optical encoder 57, to monitor chain and trolley movement. Clutch 71 slips when paddle 42 is moved up against a wafer. Slippage will occur when paddle 42 has been transported toward the wafer a distance sufficient to enable suction engagement without engagement actually being achieved. Clutch 71 thus prevents the trolley from breaking a wafer (by pressing it too hard against the paddle). Trolley 20 is driven by a similar mechanism.

Figure 4B:
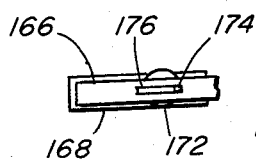

Referring to FIGS. 1, 4a and 4b, there is shown the mechanism for rotating arm 32 about vertical axis 600 in order to rotate the wafers. Wafer transfer arm 32 consists of solid member 166 and hollow member 168. Stepper motor 170 (FIG. 6) is connected to cam 172, which has pin 174 (FIGS. 4a and 4b) extending into slot 176 in member 166. Member 166 is rigidly attached to member 140 which supports paddle 42. Members 140 and 168 are attached by spring-steel flexure 141, which permits rotation between member 168 and paddle 42.

Figure 6:
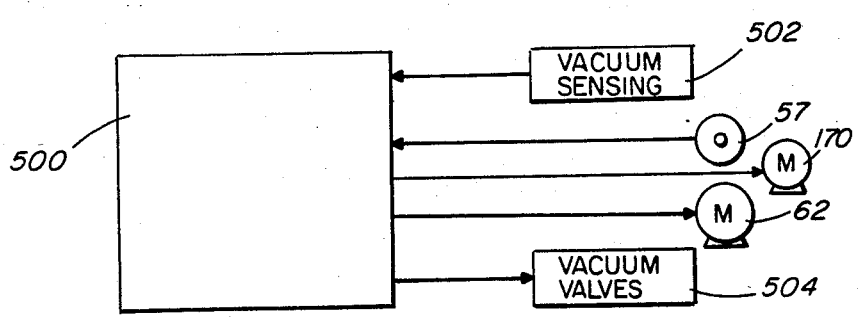
FIG. 6 is a functional block diagram of the wafer engagement control system.

Referring to FIG. 6, control circuitry 500 is a digital computer programmed to control the vacuum engagement of wafers 11 by paddle 42 and to make adjustments in the position of paddle 42 to solve problems in wafer engagement. Control circuitry 500 is connected to receive inputs from pressure sensors 502 and optical encoder 57 and to provide outputs to servo motor 62, controlling movement of plastic boat trolley 22, and to vacuum control valves 504. The motor and optical encoder for quartz boat trolley 20 are also connected to control means 500 but are not shown.

OPERATION

Two plastic boats 12, filled with wafers 11, are washed and then secured to platform 30, of trolley 22.

The alignment angle theta (FIG. 4a) necessary to align paddle 42 with slots in boat 14 is determined by means such as described in Ser. No. 381,292, now U.S. Pat. No. 4,493,606, incorporated by referernce), and paddle 42 is rotated about a vertical axis by precisely that angle. This is accomplished by activating stepper motor 170, which rotates cam 172 causing pin 174 (FIGS. 4a and 4b) to translate longitudinally in slot 176 in member 166 of arm 32. This causes member 166, which is rigidly affixed to paddle 42, but flexibly attached to member 168 via spring-steel flexure 141, to rotate about the vertical axis in relation to member 168.

Referring to FIG. 1, wafer transfer begins with paddle 42 being moved into the first of the two plastic boats between one end of the first boat and the first wafer. That paddle location is the same for every transfer. The external vacuum source providing suction at openings 154 is activated, and trolley 22 is advanced at speed $V_1$, with circuitry 500 receiving inputs from pressure sensors 502 until it is sensed that one of the four vacuum openings has been fully or partially closed by contact between the first wafer and the raised ridge 15 surrounding that first opening. The speed of trolley 22 is then immediately slowed to a reduced speed $V_2$ (0.1 $V_1$) until at least two openings are closed, at which time the trolley comes to a full stop. During pickup of the first wafer, it is engaged by the two bottom openings, because there is not enough room between it and the end of the boat to fit the entire paddle.

Paddle 42, with the first wafer held to it by the suction provided at openings 154, is then raised, translated over the quartz boat which has been located by trolley 20 in the precise position for receiving the first wafer, and lowered into the quartz boat.

A soft placement mechanism such as described in Ser. No. 381,292, now U.S. Pat. No. 4,493,606, is used to provide a soft final placement of the wafer in the quartz boat. The vacuum source for suction of vacuum openings 154 is then turned off; the quartz boat is translated slightly to move the wafer away from the paddle, and the paddle is raised from the quartz boat and returned to the plastic boat.

The same general wafer transfer procedure is repeated for the remaining wafers, except that the control scheme described below is employed to enable adjustments to the wafer engagement operation in response to failure to engage a wafer on the first try.

Figure 7:
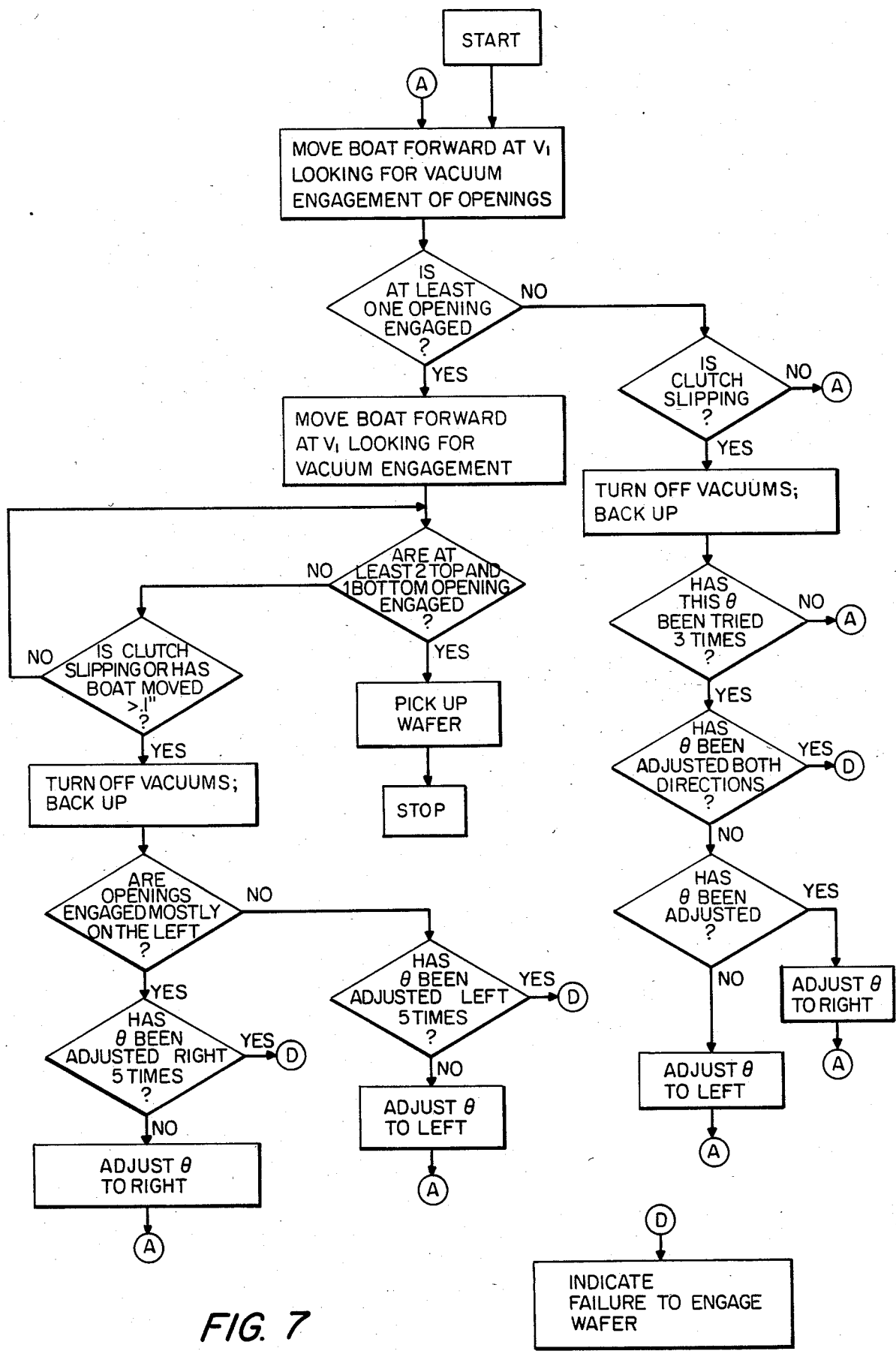
FIG. 7 is a flow chart of a program implemented by the FIG. 6 control system.

Referring to the FIG. 7 flow chart, wafer pickup and transfer begins with paddle 42 being moved into the plastic boat between the end of the boat and the second wafer. The boat is moved forward at a velocity $V_1$ with control circuitry 500 receiving inputs from pressure sensors 502 looking for a vacuum engagement of at least one opening and receiving inputs from optical encoder 71 permitting it to determine if clutch 71 is slipping.

We first describe the operation when there are no problems. When an opening 154 engages the wafer, the respective pressure sensor 502 senses that and provides an input signal to circuitry 500, and thereafter boat 22 is moved at a slower speed $V_2$ looking for a vacuum engagement of three of the four openings. If engagement at two top openings and one bottom opening is sensed, then boat 22 is stopped, and paddle 42 is raised to lift wafer 11 out of the boat.

Now we turn to describing the operation when there are problems in engaging a wafer. If during the travel of paddle 42 toward wafer 11, it is determined, via optical encoder 57 prior to sensing engagement at even one opening, that clutch 71 is slipping, the vacuums are turned off; trolley 22 is backed up; the vacuums are turned on; and the boat moves forward at $V_1$ again, making a further attempt to obtain suction engagement. If the clutch slips again, the vacuums are once again turned off; the boat is backed up; the vacuum is turned on, and the boat is moved forward again, making a final attempt to obtain suction engagement at this orientation of engagement paddle 46. The third time that the clutch slips, the vacuums are turned off; the angle theta is adjusted in one direction (to change the orientation between engagement paddle 42 and wafer 11), and the boat is moved forward again at $V_1$ up to three times, each time determining whether there has been engagement of at least one opening. If the clutch slips during each of the three attempts, then theta is adjusted to the other direction, and the boat is moved forward three times again. If during any of these attempts engagement of an opening is sensed, the boat is then moved at $V_2$ as described above, with control circuitry 500 sensing whether there is engagement of three openings. If after completing all the attempts and making all the adjustments described above there has been no engagement, control circuitry 500 places the machine in the engagement failure mode, providing an indication to the operator, and waiting for operator acknowledgement.

We turn now to description of the operation when there has been suction engagement at one opening, and trolley speed has been reduced to $V_2$, but there has not been engagement at at least two top openings and one bottom opening. Lack of such engagement is not considered to be a failure until the clutch has slipped, or the boat has moved greater than 0.10" beyond the position at which engagement with one opening was made. If either condition is detected, the vacuums are turned off, the trolley is backed up, and it is determined if the openings have been engaged mostly on the left side or the right side. If the engagement has been mostly on the left side, theta is adjusted to move the right side of the paddle 42 closer to the wafer. If the engagement has been mostly on the right side, theta is adjusted to move the left side of paddle 42 closer to the wafer. If an equal number of openings are engaged on both sides, then the theta is arbitrarily adjusted to move the left side of paddle 42 closer to the wafer. The boat is then moved forward again at $V_2$ in a further attempt to obtain proper suction engagement, with control circuitry 500 looking for changes in pressure indicating that there is engagement or close proximity of an opening to the wafer. If there still is failure to obtain engagement, the theta adjustment and further attempts are made up to four more times, with theta being adjusted slightly more each time. If the proper engagement is still not sensed, the machine goes into the engagement failure mode.

When there has been an equal number of openings engaged on both sides, and the paddle has been arbitrarily rotated in one direction (to break the tie), there should, on the next attempt, be either proper engagement or a worsened condition (fewer openings are engaged). In the latter case, the paddle is rotated in a direction to improve engagement.

By using this procedure, the number of times that the transfer operation must be halted in response to failure to engage wafers will be reduced, resulting in a much more efficient transfer.

Transfer from the quartz boat to the plastic boat is accomplished in the reverse manner, using soft pickup instead of soft placement.

The arrangement of vacuum openings on the paddle has the advantage of being able to support even badly warped wafers (e.g., 1 mil for every inch of wafer diameter). By providing a raised edge around the vacuum openings, the wafer is supported off of the surface of the paddle, thereby providing room for warpage without the wafer touching the rest of the paddle. By locating the vacuum openings near the periphery of the wafer, the effects of warpage on the location of the wafer edges is lessened, because in the small distance between the vacuum openings (where the wafer is held at a known location with respect to the paddle) and the wafer edge, the warpage cannot possibly cause very much displacement of the edge. This is to be contrasted to holding the wafer at its center, wherein much greater variation in the locations of the wafer edge could result (and thus make placement of the wafer edges in boat slots all the more difficult). Five inch (or 125 mm) wafers are especially subject to bad warpage, but the apparatus disclosed is fully able to accomodate such wafers.

A listing of the program (in C language) used on digital computer 500 (an Intel 8080 processor) is as follows:

Copyright 1982    Proconics, Inc.

```
 6: */
 7: #include "wtsolb.h"
 8: #include "error.h"
 9:
10: #define THCNT 10
11: #define RSIDE ( VSW1 | VSW2 )
12: #define LSIDE ( VSW3 | VSW4 )
13:
14: /* Standard Q pickup ( all 4 vacs. 2 Upper and either lower. )
15:    Return 0 if we have the wafer. return ( 0 if something went wrong. */
16: PickUp(boat. spec. max) /* Move boat looking for wafer. return 0 when all vacs found */
17: {     int err;
18:       int nsteps;
19:       int rpoints, lpoints;   /* used to keep track of how many times more
20:                                  vacuums are seen on the right side. or left side */
21:       int thcnt;               /* Count down to 0 before moving Theta */
22:       int specfind;            /* spec used in calling findwaf          */
23:       int i. test. steps.speed;
24:       int test1. test2. i1. i2. trys. trvsl. Thtrvs;
25:       char thguess;            /* guess at theta move if nothing else */
26:       char thtrv;
27:       int TRYS;
28:       int fedge;     /* ploc where vac was first sensed */
29:       stallpos = 0;  /* Position where servo stalls before sensing any vacuums
30:                        ( for a stubborn wafers ) */
```

```
31:         test = VSEN1!VSEN3!VSEN4!VSEN2;    /* vac ports to wait for...    */
32:         if ( spec ) test = VSW2!VSW3;     /* pickup wafer with lower two vacs only */
33:         if (Paddle(1,test)) {
34:                 if ( pickerr(boat)) return(-1);
35:         }
36:         if ( boatcheck() ) return(-1);
37:         Thtrys = 5;
38:         TRYS = 20 * THCNT;                /* how many times before giving up */
39:         speed = 5;
40:         steps = 10;
41:         test1 = VSEN1!VSEN3!VSEN4;         /* vac ports to wait for...    */
42:         test2 = VSEN1!VSEN4!VSEN2;         /* vac ports to wait for...    */
43:         /* pick up wafer with a minimum of VSEN1, VSEN4, and either of the other 2 */
44:         if ( boat == QBOAT ) {
45:                 steps = 5;
46:                 TRYS = 5 * THCNT;
47:         }
48: /* Creep steps at a time looking for any vacuums. Give up
49:         each try after nsteps. Try trys times.
50: */
51:         thtry = 0;
52:         thguess = 16;
53:         trys = 1;
54: agng:   nsteps = 600;
55:         rpoints = lpoints = 0;
56:         specfind = spec;
57:         thcnt = THCNT;
58:         if (Paddle(1,test)) if (pickerr(boat)) return(-1);

59:         while ( nsteps == 600 ) {
60:                 if ( boat == PBOAT ) {
61:                         if( ploc <= (P2FIRST+200)) nsteps = P2FIRST - ploc;
62:                         else {
63:                                 if ( (ploc ) (P2FIRST+200)) &&
64:                                         (ploc < ( P1GO - 1200)))
65:                                         /* Move paddle to other P boat */
66:                                         if ( shift()) return(-1);
67:                                 nsteps = P1FIRST - ploc;
68:                         }
69:                         nsteps += 600;
70:                 }
71:                 else {
72:                         if( ploc ) (SCANST + 450 ) && spec ) {  /* make it not spec */
73:                                 if(Paddle(0,test)) return(-1);
74:                                 if( MoveBoat( SCANST - QMAX, QBOAT, 50)) return(-1);
75:                                 SLRelYZ(QPICK - YZMotor.where);
76:                                 return(PickUp(QBOAT, 0, 0));
77:                         }
78:                         if( !spec ) nsteps = ( SCANST + 14500) - ploc;
79:                 }
80:                 /* Creep forward looking continuously for any vacuums. stop
81:                    when the first vacuum is found and zero out the DAC */
82:                 nsteps = FindWaf( boat, max ? max - ploc:nsteps,specfind );
83:                 if( boat == PBOAT ) if( max && ( nsteps == 0)) return(NOT_FOUND);
84:                 if ( nsteps < 0 ) {
85:                         if (!trys--) { /* Try a theta adjust */
86:                                 if(backup(boat)) return(-1);
87:                                 switch ( thtry++ ) {
88:                                         case 0: slick( &ThMotor, thguess);
89:                                                 break;
90:                                         case 1: slick( &ThMotor, -2 * thguess);
91:                                                 break;
92:                                         default: slick( &ThMotor, thguess);
93:                                                 thtry = 0;
94:                                                 thguess += 16;
95:                                                 if ( pickerr(boat)) return(-1);
96:                                 }
97:                                 specfind = TRUE;
98:                                 trys = 1;
99:                                 goto agng;
100:                        }
101:                }
102:                if ( nsteps <= 0 ) nsteps = 600;
103:        }
104:        /* First vac found at this point. */
105:        fedge = ( boat == QBOAT ) ? ploc: ploc;
106:        trys1 = TRYS;
107:        nsteps = 50;
108:        while (--nsteps >= 0)                /* then look for wafer.        */
109:        {
```

```
110:        i= inp(VACSEN) & test:
111:
112:        if( spec ) { /* we are using  lower vacs only! */
113:                if ( i & VSW2 ) i |= VSW1: /* if no 2 then no 1 */
114:                if ( i & VSW3 ) i |= VSW4: /* if no 3 then no 4 */
115:        }
116:
117:        i1 = i & test1: /* i1 or i2 = 0 means at least 3 out of 4 vacs */
118:        i2 = i & test2:
119:        if ( !i1 || !i2 ) goto gotit;          /* got 3 or 4 out of 4  */
120:        if (!trys1--) {
121:                if ( pickerr(boat)) return(-1):
122:                trys = 3:
123:                goto agno;
124:        }
125:        if (( i & test) != test) {             /* got it partially     */
126:                if (((~i & RSIDE) == RSIDE ) || ( (i&LSIDE) == LSIDE)) lpoints++:
127:                if (((~i & LSIDE) == LSIDE ) || (( i&RSIDE) == RSIDE)) rpoints++:
128:                thcnt--:
129:                if ( thcnt <= 0 ) {            /* Try a theta adjust */
130:                        THadjust( boat. test, lpoints. rpoints):
131:                        thcnt = THCNT;
132:                        if ( !Thtrys-- ) {
133:                                if ( pickerr(boat)) return(-1):
134:                                Thtrys = 4:
135:                        }
136:                        goto agno;
137:                }
138:        }
139:        if(aservo(steps. speed. 1.boat. 0)){ /* servo stalled */
140:                cprintf("I'm REALLY having trouble with this one. Vacsen = %02x\r\n".
141:                        inp(VACSEN)):
142:                /* Try a new Theta based on lpoints and rpoints */
143:                THadjust( boat. test. lpoints. rpoints):
144:                thcnt = THCNT:
145:                if (!trys--) { if ( pickerr(boat)) return(-1): trys = 3: }
146:                goto agno;
147:        }
148:        }
149:        if(Paddle(0.VSW1|VSW2|VSW3|VSW4)) return(-1):
150:        if(aservo(400.10.-1.boat.0)) if(fixcntr()) return(-1):
151:        THadjust( boat. test. lpoints. rpoints):
152:        if (!trys--) { if ( pickerr(boat)) return(-1): trys = 3: }
153:        goto agno;
154:
155: gotit: /* We have the wafer */
156:        if ( i1 && i2 ) {       /* we lost it */
157:                if(backup(boat)) return(-1):
158:                goto agno;
159:        }
160:        return(0);
161: }
```

OTHER EMBODIMENTS

Other embodiments are within the scope of the following claims.

What is claimed is:

1. Apparatus for transporting an object, said apparatus comprising an engagement element with a plurality of openings in a flat surface, a first said opening being on one side of an axis passing through said element, and a second said opening being on another side of said axis, suction means for providing a below-atmospheric pressure at said openings for the purpose of adhering said object to said engagement element, transport means for transporting said engagement element relative to said object to bring said openings close enough to a flat engagement surface of said object to enable suction engagement of said object at said openings, said transport means including means for rotating said engagement element about an axis parallel to said flat surface, position detection means for sensing the relative position of said object and said engagement element, sensing means for sensing suction engagement at said openings, and processing means including engagement-failure-detection means responsive to said sensing and position detection means for detecting when suction engagement has occurred at said first opening but has not occurred at said second opening despite said engagement element having been transported toward said object a distance sufficient to enable said engagement, and control means responsive to said engagementfailure-detection means for providing a control signal to said transport means to rotate said engagement element to bring said second opening closer to said object.

2. The apparatus of claim 1 wherein said transport means includes means for moving said engagement element along an engagement direction.

3. The apparatus of claim 2 wherein said control means includes means for causing said transport means to separate said element and object along said engagement direction after an initial failed attempt to obtain suction engagement and before rotating said engagement element and to make at least one further attempt to engage said object.

4. The apparatus of claim 3 wherein said means for causing includes means for making at least two further attempts to engage after said initial failed attempt.

5. The apparatus of claim 1 wherein said transport means includes means for moving said engagement element along an engagement direction, and said control means includes means for causing said transport means to separate said element and object along said engagement direction and make at least one further attempt to engage said object after an initial failed attempt at an initial orientation of said engagement element relative to said direction without changing the orientation, and, if still unsuccessful at engaging said object, to cause rotation of said engagement element in one direction to a new orientation and cause further attempts at engagement at the new orientation, and, if still unsuccessful in engaging said object, cause rotation of said engagement element in another direction and cause further attempts at engagement at this orientation, and, if still unsuccessful at engaging said object, provide an indication of failure to engage said object.

6. The apparatus of claim 1 wherein said sensing means comprises pressure sensors connected to vacuum lines connecting said suction opening to said suction means.

7. The apparatus of claim 1 wherein said transport means comprises a motor driving an object holder.

8. The apparatus of claim 7 wherein said transport means comprises a clutch operably connected between said motor and said object holder, and said position detection means comprises means detecting the position of said object holder.

9. The apparatus of claim 8 wherein said engagement-failure-detection means includes means to detect that said element has been transported toward said object a distance sufficient to enable engagement by detecting that said position sensor senses lack of movement of said object holder at the same time that said motor is operating, by detecting that said clutch is slipping.

10. The apparatus of claim 8 wherein said engagement-failure-detection means includes means to detect that said element has been transported toward said object a distance sufficient to enable engagement by said engagement element when it detects that said object holder has moved a given distance after there has been suction engagement at one said opening.

* * * * *